(12) United States Patent
Wu et al.

(10) Patent No.: US 9,847,047 B2
(45) Date of Patent: Dec. 19, 2017

(54) DISPLAY PIXEL WITH REDUNDANT ELEMENT AND DISPLAY PANEL

(71) Applicant: Industrial Technology Research Institute, Hsinchu (TW)

(72) Inventors: Ming-Hsien Wu, Tainan (TW); Yen-Hsiang Fang, New Taipei (TW); Yao-Jun Tsai, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 241 days.

(21) Appl. No.: 14/979,543

(22) Filed: Dec. 28, 2015

(65) Prior Publication Data

US 2017/0162091 A1    Jun. 8, 2017

(30) Foreign Application Priority Data

Dec. 4, 2015 (TW) .............................. 104140731 A

(51) Int. Cl.
| | |
|---|---|
| *G09G 3/00* | (2006.01) |
| *H01L 27/15* | (2006.01) |
| *H01L 33/38* | (2010.01) |

(52) U.S. Cl.
CPC .......... *G09G 3/006* (2013.01); *H01L 27/156* (2013.01); *G09G 2300/0439* (2013.01); *G09G 2320/0233* (2013.01); *G09G 2320/0295* (2013.01); *H01L 33/38* (2013.01)

(58) Field of Classification Search
CPC ........... G09G 3/006; G09G 2320/0233; G09G 2320/0295; H01L 27/156
See application file for complete search history.

(56) References Cited

U.S. PATENT DOCUMENTS

| | | | |
|---|---|---|---|
| 8,552,436 | B2 | 10/2013 | Bibl et al. |
| 8,791,473 | B2 | 7/2014 | Yokogawa et al. |
| 8,809,875 | B2 | 8/2014 | Bibl et al. |

(Continued)

FOREIGN PATENT DOCUMENTS

| | | |
|---|---|---|
| CN | 101771119 | 7/2010 |
| TW | I425651 | 2/2014 |
| TW | 201445730 | 12/2014 |

OTHER PUBLICATIONS

"Office Action of Taiwan Counterpart Application", issued on Aug. 4, 2016, p. 1-p. 3.

(Continued)

*Primary Examiner* — Larry Sternbane
(74) *Attorney, Agent, or Firm* — JCIPRNET

(57) ABSTRACT

A display pixel suitable for being arranged on a carrier is provided. The display pixel includes a plurality of light-emitting diode chips. The light-emitting diode chips are disposed on and electrically connected to the carrier. Each of the light-emitting diode chips respectively serves as a sub-pixel and includes a semiconductor device layer, and the semiconductor device layer includes a display light-emitting mesa and at least one redundant light-emitting mesa. During a period of driving each of the light-emitting diode chips, one of the display light-emitting mesa and the at least one redundant light-emitting mesa in each of the light-emitting diode chips is capable of emitting light. A display panel including a plurality of the display pixels mentioned above is also provided.

19 Claims, 13 Drawing Sheets

(56) References Cited

U.S. PATENT DOCUMENTS

| | | | |
|---|---|---|---|
| 9,224,957 B1 | 12/2015 | Kang et al. | |
| 2006/0043391 A1* | 3/2006 | Erchak | B82Y 20/00 257/82 |
| 2013/0126891 A1 | 5/2013 | Bibl et al. | |
| 2013/0228819 A1 | 9/2013 | Engl et al. | |
| 2014/0078757 A1* | 3/2014 | Chen | H01L 25/0753 362/382 |
| 2014/0367633 A1 | 12/2014 | Bibl et al. | |
| 2015/0084054 A1 | 3/2015 | Fan et al. | |
| 2015/0103103 A1 | 4/2015 | Kim et al. | |
| 2015/0154933 A1 | 6/2015 | Bae et al. | |
| 2016/0329376 A1* | 11/2016 | Kim | H01L 27/156 |

OTHER PUBLICATIONS

Tian et al., "Size-dependent efficiency and efficiency droop of blue InGaN micro-light emitting diodes," Applied Physics Letters, Dec. 6, 2012, pp. 231110-1-231110-4.

Hwang et al., "A Hybrid Micro-Pixel Based Deep Ultraviolet Light-Emitting Diode Lamp," Applied physics express, Dec. 16, 2010, pp. 012102-1-012102-3.

Ahn et al., "Omnidirectional printing of flexible, stretchable, and spanning silver microelectrodes," Science, Mar. 20, 2009, pp. 1590-1593.

Park et al., "Printed assemblies of inorganic light-emitting diodes for deformable and semitransparent displays," Science, Aug. 21, 2009, pp. 977-981.

Gong et al., "Size-dependent light output, spectral shift, and self-heating of 400 nm InGaN light-emitting diodes," Journal of Applied Physics, Jan. 6, 2010, pp. 013103-1-013103-6.

\* cited by examiner

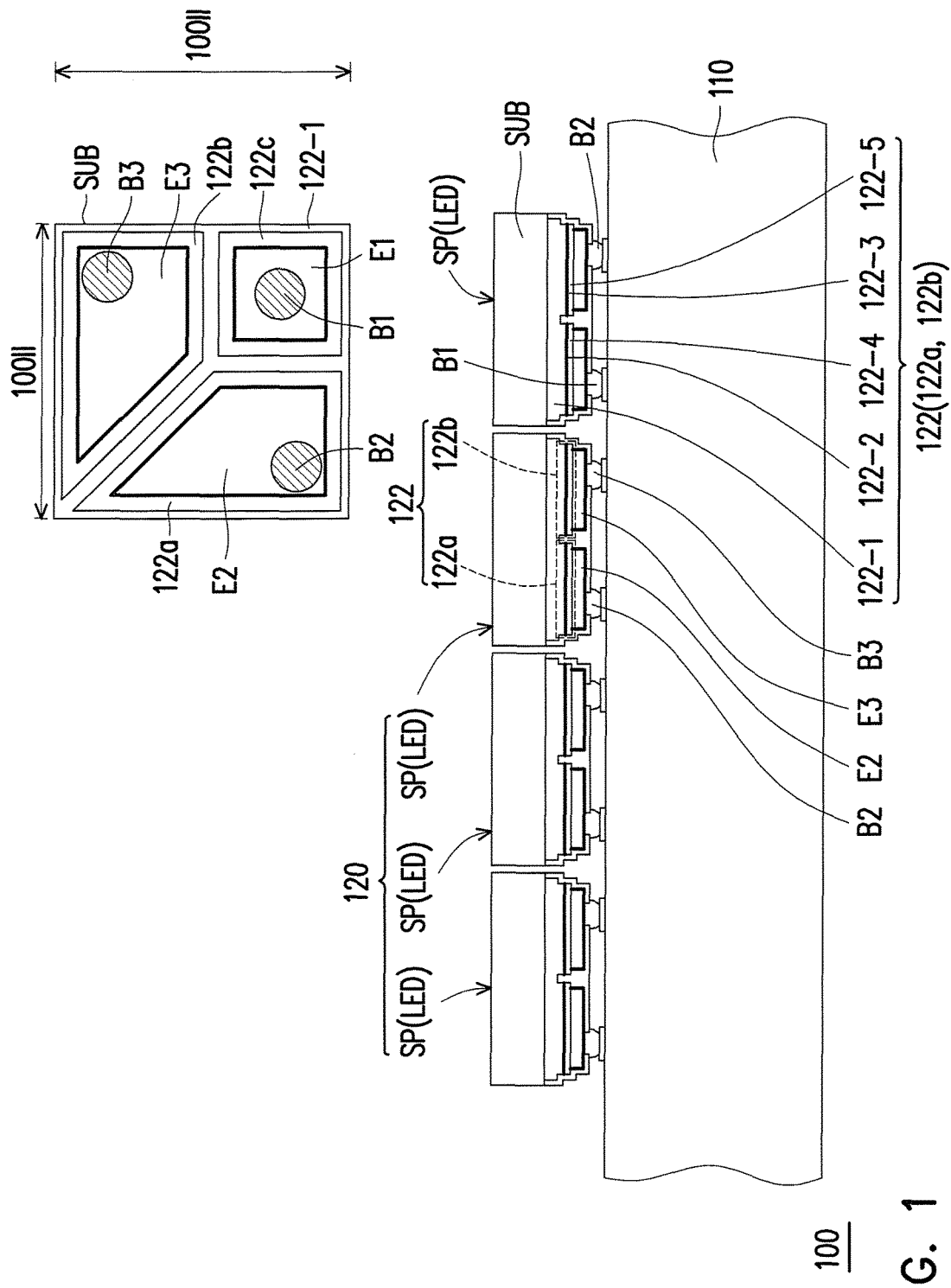

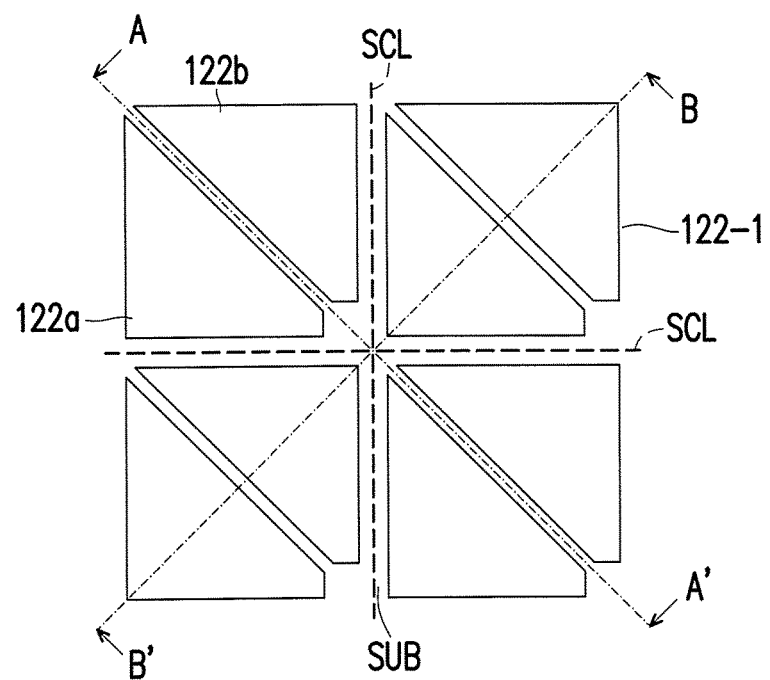
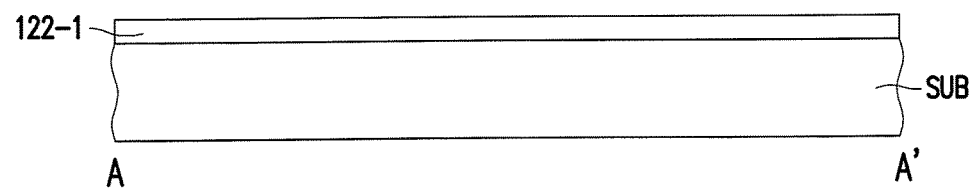
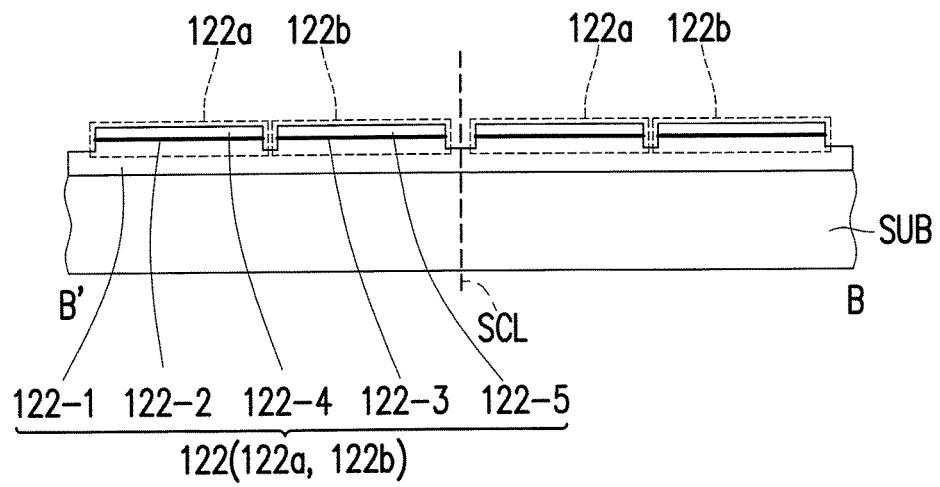
FIG. 3A

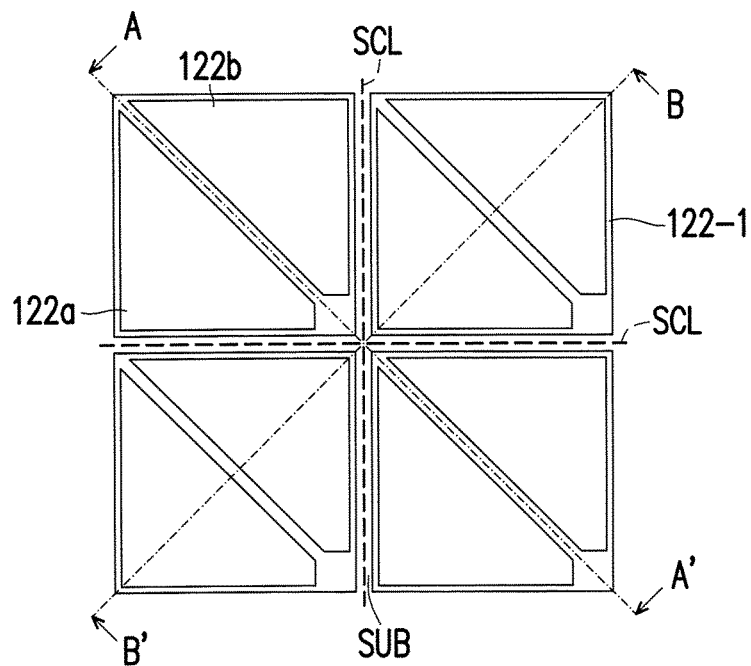
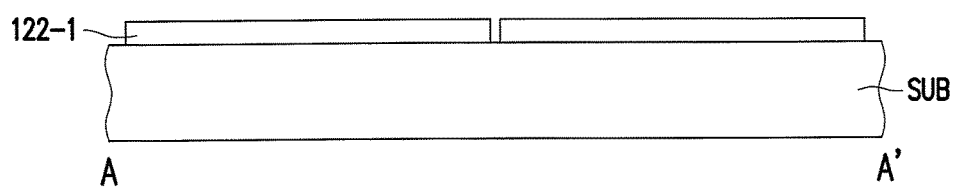
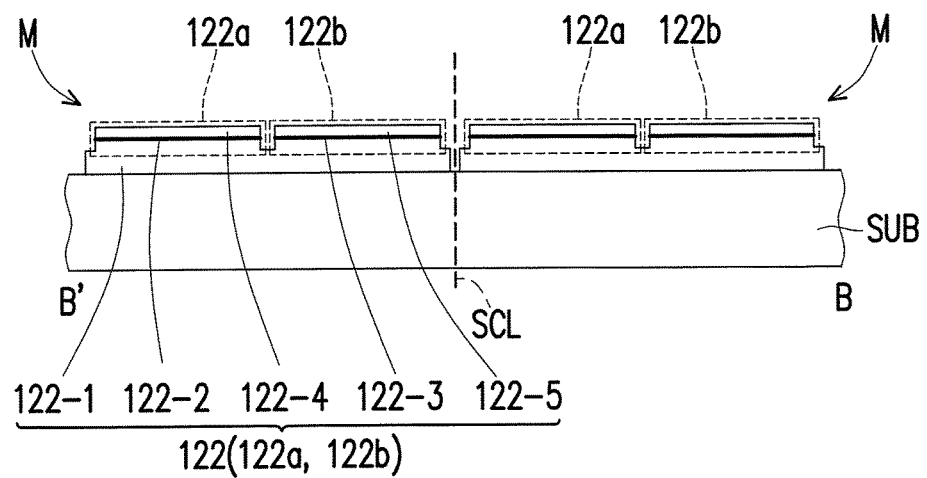
FIG. 3B

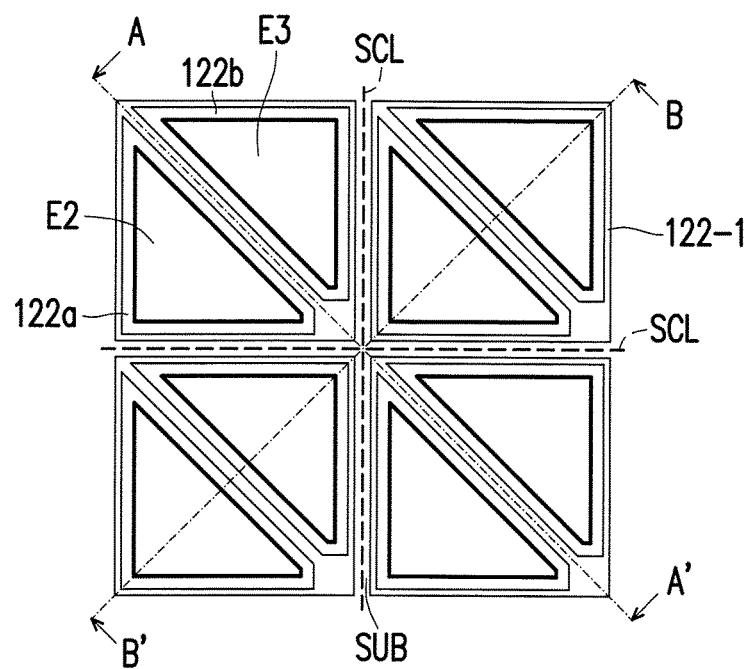
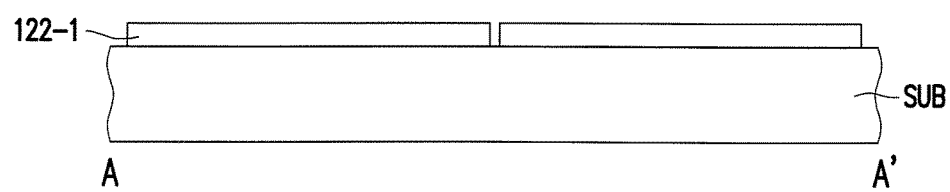
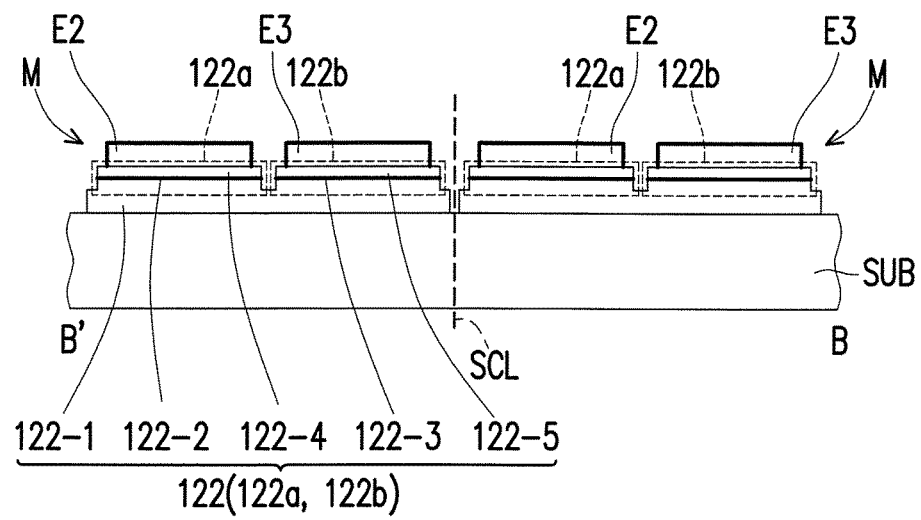
FIG. 3C

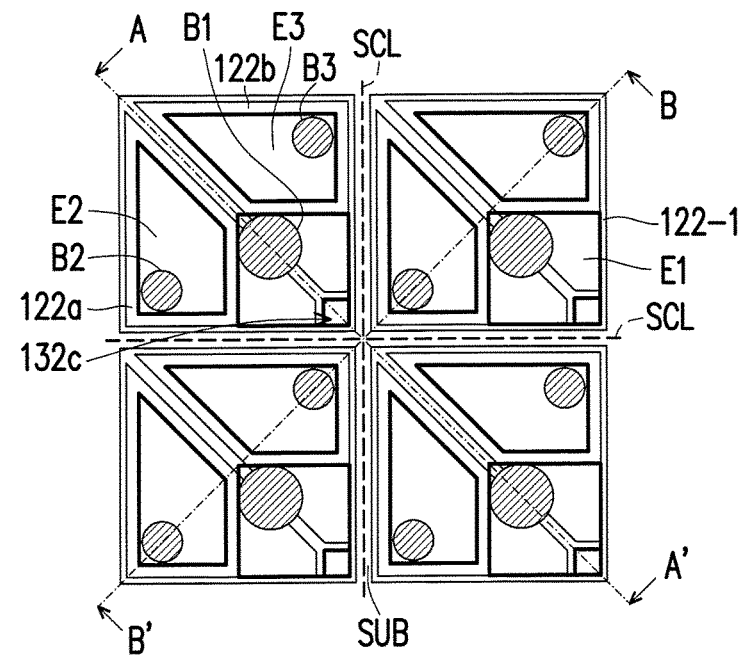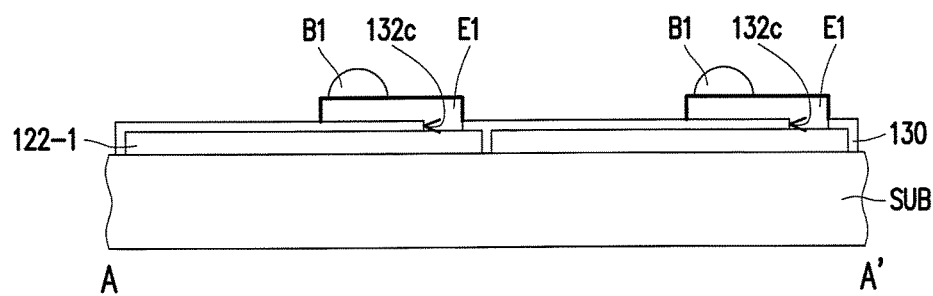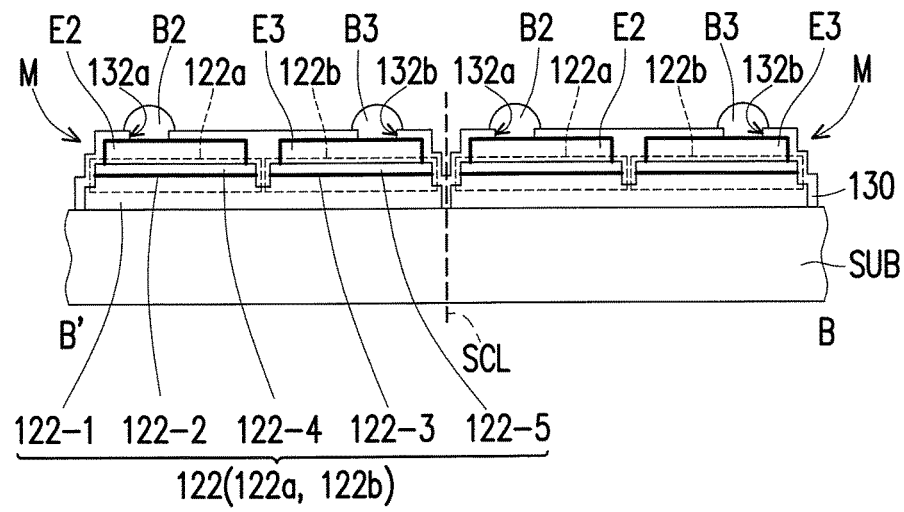
FIG. 3E

DISPLAY PIXEL WITH REDUNDANT ELEMENT AND DISPLAY PANEL

CROSS-REFERENCE TO RELATED APPLICATION

This application claims the priority benefits of Taiwan application serial no. 104140731, filed on Dec. 4, 2015. The entirety of the above-mentioned patent applications is hereby incorporated by reference herein and made a part of this specification.

TECHNICAL FIELD

The disclosure relates to a display device, and more particularly to a display pixel and a display panel.

BACKGROUND

An inorganic light-emitting diode (LED) display characterized by capability of emitting light and high brightness has been extensively applied in illumination devices, displays, projectors, and so on. For instance, monolithic microdisplays are extensively applied in projectors and face the technical challenge of colorization. At present, plural light-emitting layers capable of emitting different color beams can be formed in one single light-emitting diode chip through applying epitaxy techniques according to the related art, such that the one single light-emitting diode chip is able to provide different color beams. However, since the lattice constants of the light-emitting layers capable of emitting different color beams are not the same, these light-emitting layers cannot be easily formed on one substrate. Besides, another colorization technology has been proposed, wherein colorization can be achieved when different wavelength conversion materials are used to convert light emitted from the light-emitting diode chip. Specifically, when the light-emitting diode chip emits light, the wavelength conversion materials are excited to emit different color beams; however, issues of low conversion efficiency of the wavelength conversion materials and the non-uniformity of coating the wavelength conversion materials arise when such colorization technology is applied.

In addition to the aforesaid two colorization technologies, a transfer-bonding technique has also been proposed according to the related art, so as to transfer-bond the LEDs to a substrate. The LEDs capable of emitting different color beams may be respectively grown on proper substrates, such that the resultant LEDs are characterized by favorable epitaxial quality and light-emitting efficiency. Hence, the transfer-bonding technique applied to the light-emitting diode chips allows the brightness and the display quality of the monolithic micro-display to be enhanced.

At present, the transfer-bonding technique applied to the light-emitting diode chips is still notorious for low manufacturing yield and low alignment accuracy. In order to raise the manufacturing yield, the dysfunctional light-emitting diode chips that already undergo the transfer-bonding process need be replaced or repaired, which however increases manufacturing costs and labor hours. According to the related art, redundant light-emitting diode chips may be employed to replace the dysfunctional light-emitting diode chips; nevertheless, more light-emitting diode chips are required in this case, and the relevant costs will also be increased. In addition, using an excessive number of redundant light-emitting diode chips often leads to the difficulty in reducing the distance (dot pitch) among the light-emitting diode chips, which is rather unfavorable for high-resolution display.

In view of the above, how to improve the manufacturing yield without significantly increasing the costs and the arranging pitch among the light-emitting diode chips has become one of the concerns in the pertinent field.

SUMMARY

The disclosure provides a display pixel using light-emitting diode (LED) chips as sub-pixels and a display panel.

In an exemplary embodiment of the disclosure, a display pixel adapted to be arranged on a carrier is provided. The display pixel includes a plurality of light-emitting diode chips. The light-emitting diode chips are disposed on and electrically connected to the carrier. Each of the light-emitting diode chips respectively acts as a sub-pixel and includes a semiconductor device layer, and the semiconductor device layer includes a display light-emitting mesa and at least one redundant light-emitting mesa. During a period of driving each of the light-emitting diode chips, one of the display light-emitting mesa and the at least one redundant light-emitting mesa in each of the light-emitting diode chips is capable of emitting light. In an exemplary embodiment of the disclosure, a display panel including a plurality of the display pixels mentioned above is also provided.

A method of driving a display panel, comprising: providing a display panel, the display panel comprising a carrier and a plurality of the display pixels as mentioned above, the display pixels being arranged in an array on the carrier; driving the display pixels by the carrier and detecting whether the display light-emitting mesas in the display pixels perform a display function normally; and if at least one of the display pixels is deemed as an abnormal display pixel, disabling the display light-emitting mesa in the abnormal display pixel and enabling the at least one redundant light-emitting mesa in the abnormal display pixel.

In view of the above, the light-emitting diode chips act as the sub-pixels in the display pixel in the disclosure, and each of the light-emitting diode chips includes the display light-emitting mesa and the redundant light-emitting mesa; thereby, if the display light-emitting mesa cannot be driven and thus cannot perform the display function, the redundant light-emitting mesa can replace the display light-emitting mesa to perform the display function. As such, the manufacturing yield of the display pixel and the display panel can be significantly improved without increasing the dimension of the pixel or increasing the arranging pitch between the pixels in the pixel array.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1 is a schematic diagram illustrating a display panel according to a first exemplary embodiment of the disclosure.

FIG. 3A to FIG. 3E are schematic flowcharts of manufacturing a light-emitting diode chip according to a second exemplary embodiment of the disclosure.

DETAILED DESCRIPTION OF DISCLOSED EMBODIMENTS

First Exemplary Embodiment

Figure 2A:
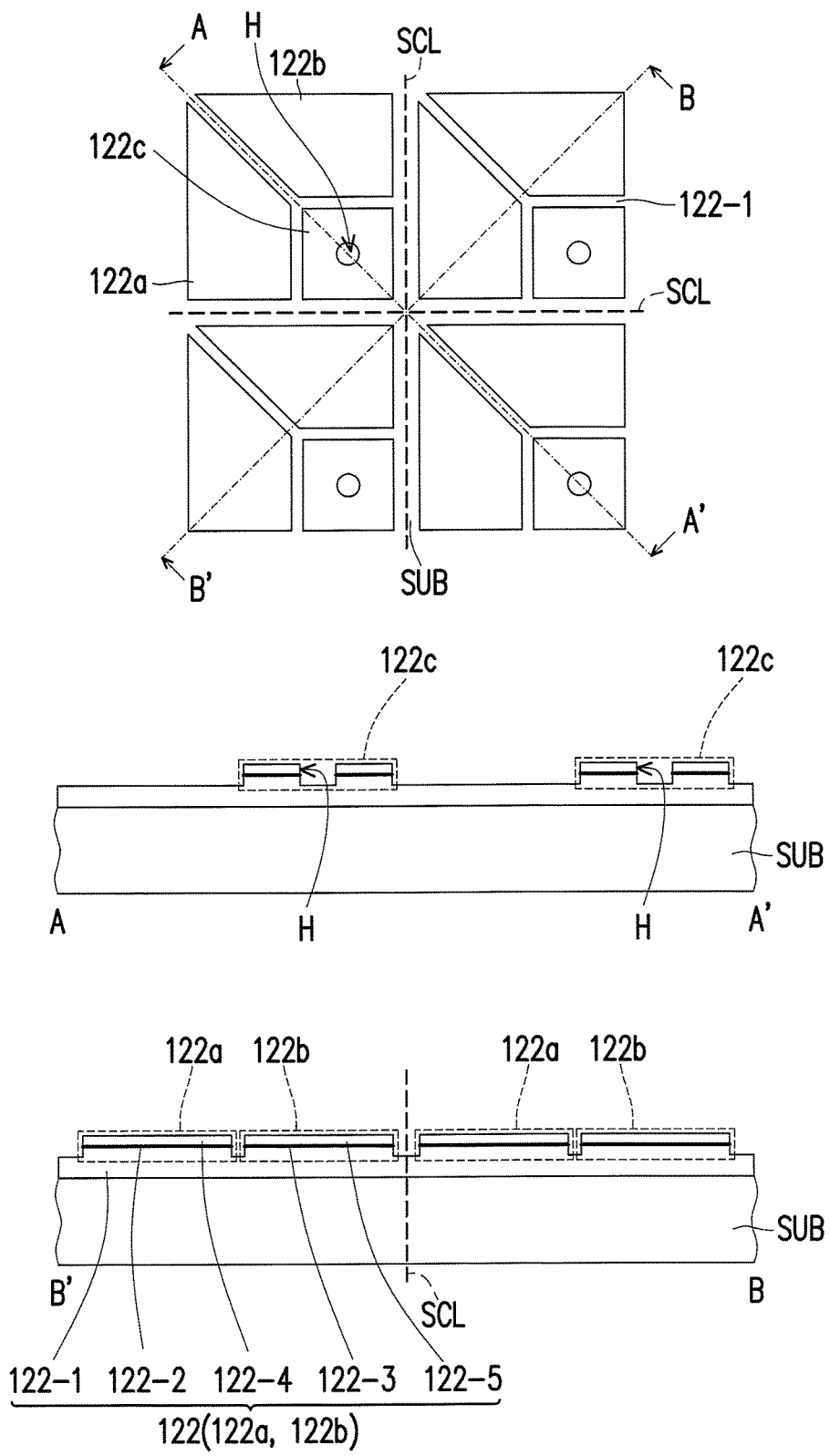
FIG. 2A to FIG. 2E are schematic flowcharts of manufacturing the light-emitting diode chip according to the first exemplary embodiment of the disclosure.

FIG. 1 is a schematic diagram illustrating a display panel according to a first exemplary embodiment of the disclosure. The lower portion of FIG. 1 is a schematic cross-sectional diagram illustrating the display panel according to the first exemplary embodiment, and the upper portion of FIG. 1 is a top view of light-emitting diode chips (i.e., sub-pixels).

As shown in FIG. 1, a display panel 100 provided in the present exemplary embodiment includes a carrier 110 and a plurality of display pixels 120 arranged on and electrically connected to the carrier 110. In the present exemplary embodiment, the display panel 100 is, for instance, a monolithic micro-display that can be applied in a micro-display or in a digital signage. Based on actual design requirements, the carrier 110 provided herein is a circuit board, a complementary metal oxide semiconductor integrated circuit (CMOS-IC), or a carrier of other types. Specifically, the aforesaid carrier 110 is, for instance, a silicon-based circuit board having through silicon vias (TSV) or an integrated circuit (IC) chip having CMOS devices. Besides, the circuit in the carrier 110 is electrically connected to the display pixels 120, so as to drive each of the display pixels 120 to display the required color or gray level.

In the display panel 100 provided in the present exemplary embodiment, each of the display pixels 120 includes a plurality of light-emitting diode chips LED suitable for emitting different color beams, and each of the light-emitting diode chips LED acts as a sub-pixel SP. The light-emitting diode chips LED in each of the display pixels 120 are suitable for emitting different color beams and include, for instance, red light-emitting diode chips, green light-emitting diode chips, and blue light-emitting diode chips, which should however not be construed as limitations to the disclosure. Besides, the light-emitting diode chips LED are electrically connected to the carrier 110 in a flip-chip-bonding manner, for instance. Particularly, the light-emitting diode chips LED are electrically connected to the circuit in the carrier 110 through bumps B1, B2, and B3. Note that the distance among the light-emitting diode chips LED is associated with the display resolution of the display panel 100; in the present exemplary embodiment, the distance among the light-emitting diode chips LED may be determined according to the display resolution of the display panel 100. Here, the distance among the light-emitting diode chips LED is within a range from 500 micrometers to 1000 micrometers, for instance.

After the light-emitting diode chips LED are transfer-bonded to the carrier 110, the light-emitting diode chips LED may not perform the normal display function, such that defective dots are formed on the display panel 100, and that the manufacturing yield of the display panel 100 may be reduced. In order to improve the manufacturing yield of the display panel 100 and reduce the time and costs required for repairing the display panel 100, a light-emitting diode chip LED equipped with a redundant light-emitting mesa is provided in the present exemplary embodiment and will be elaborated below.

In the present embodiment, each of the light-emitting diode chips LED includes a substrate SUB and a semiconductor device layer 122. The semiconductor device layer 122 is arranged on the substrate SUB and includes a display light-emitting mesa 122a and at least one redundant light-emitting mesa 122b. During a period of driving each of the light-emitting diode chips LED, one of the display light-emitting mesa 122a and the at least one redundant light-emitting mesa 122b in each of the light-emitting diode chips LED is capable of emitting light. Particularly, in the period of driving each of the light-emitting diode chips LED, only the display light-emitting mesa 122a or the redundant light-emitting mesa 122b in each of the light-emitting diode chips LED is driven to perform the display function.

In the present exemplary embodiment, the substrate SUB is made of sapphire, silicon, silicon carbide, and so on. In another feasible exemplary embodiment, the substrate SUB may be removed during the manufacturing process of the light-emitting diode chips LED, and thus the substrate SUB is an optional component.

In the present exemplary embodiment, the semiconductor device layer 122 in each of the light-emitting diode chips LED includes a first-type doped semiconductor layer 122-1, a first light-emitting layer 122-2 and a second light-emitting layer 122-3 separated from each other, and a second-type doped semiconductor layer. The first light-emitting layer 122-2 and the second light-emitting layer 122-3 are arranged on a portion of the first-type doped semiconductor layer 122-1. The second-type doped semiconductor layer includes a first semiconductor pattern 122-4 and a second semiconductor pattern 122-5 separated from each other. The first light-emitting layer 122-2 is located between the first-type doped semiconductor layer 122-1 and the first semiconductor pattern 122-4 of the second-type doped semiconductor layer, and the second light-emitting layer 122-3 is located between the first-type doped semiconductor layer 122-1 and the second semiconductor pattern 122-5 of the second-type doped semiconductor layer. As shown in FIG. 1, the first-type doped semiconductor layer 122-1, the first light-emitting layer 122-2, and the first semiconductor pattern 122-4 of the second-type doped semiconductor layer constitute the display light-emitting mesa 122a, and the first-type doped semiconductor layer 122-1, the second light-emitting layer 122-3, and the second semiconductor pattern 122-5 of the second-type doped semiconductor layer constitute the redundant light-emitting mesa 122b.

For instance, the first-type doped semiconductor layer 122-1 is an n-type doped semiconductor layer, the first and second light-emitting layers 122-2 and 122-3 are single- or multi-quantum well layers, and the first semiconductor pattern 122-4 and the second semiconductor pattern 122-5 are p-type doped semiconductor layers, for instance.

As shown in the upper portion of FIG. 1, each of the light-emitting diode chips LED in the present exemplary embodiment may further include a first electrode E1, a second electrode E2, and a third electrode E3. The first electrode E1 is electrically connected to the first-type doped semiconductor layer 122-1, the second electrode E2 is electrically connected to the first semiconductor pattern 122-4 of the second-type doped semiconductor layer, and the third electrode E3 is electrically connected to the second semiconductor pattern 122-5 of the second-type doped semiconductor layer. In addition, each of the light-emitting diode chips LED may further include a first bump B1, a second bump B2, and a third bump B3. The first bump B1 is electrically connected to the first electrode E1, the second bump B2 is electrically connected to the second electrode E2, and the third bump B3 is electrically connected to the third electrode E3. As shown in FIG. 1, the first electrode E1 and the second electrode E2 serve to provide a current to the display light-emitting mesa 122a having the first light-emitting layer 122-2, and the first electrode E1 and the third electrode E3 serve to provide a current to the redundant light-emitting mesa 122b having the second light-emitting layer 122-3.

After the light-emitting diode chips LED are transfer-bonded to the carrier 110, if the display light-emitting mesa 122a undergoes a test and fails to perform the normal display function, the display light-emitting mesa 122a may be disabled by a control circuit of the carrier 110, and the redundant light-emitting mesa 122b can be enabled by the control circuit of the carrier 110. For instance, the control circuit of the carrier 110 is an application specific integrated circuit (ASIC) or any other type of circuit. It is noted that the control circuit is not limited to be formed in the carrier. In the present exemplary embodiment, a current-voltage correlation of the display light-emitting mesa 122a can be measured to determine whether abnormal open circuit or short circuit occurs in the display light-emitting mesa 122a. The step of disabling the display light-emitting mesa 122a is carried out by not providing any electrical signal to the second electrode E2; thereby, no driver current flows between the first electrode E1 and the second electrode E2, and thus the display light-emitting mesa 122a is disabled; the step of enabling the redundant light-emitting mesa 122b is carried out by providing an electrical signal to the third electrode E3; thereby, a driver current flows between the first electrode E1 and the third electrode E3, and thus the redundant light-emitting mesa 122b is enabled. Through simple circuit control, the enabled redundant light-emitting mesa 122b can easily replace the display light-emitting mesa 122a to perform the display function. For instance, a controller (e.g., a micro-processing unit) may be applied to detect whether the display light-emitting mesa 122a is abnormal (e.g., whether the open circuit or short circuit occurs); if one of the display light-emitting mesas 122a is detected to be an abnormal display light-emitting mesa, the abnormal display light-emitting mesa 122a is disabled, and the corresponding redundant light-emitting mesa 122b is enabled. That is, when the display light-emitting mesa 122a is unable to perform the normal display function, it is not necessary to remove the dysfunctional light-emitting diode chip LED from the carrier 110 nor is required to place another light-emitting diode chip LED onto the carrier 110 according to the present exemplary embodiment. Through proper circuit control, the dysfunctional light-emitting diode chip LED can be repaired. The display light-emitting mesa 122a and the redundant light-emitting mesa 122b in the same light-emitting diode chip LED are formed at the same time on the same manufacturing conditions according to the present exemplary embodiment, and the light-emitting area of the display light-emitting mesa 122a is similar or identical to the light-emitting area of the redundant light-emitting mesa 122b; hence, given the same driving conditions, the display effects achieved by the display light-emitting mesa 122a and the redundant light-emitting mesa 122b are almost the same. As a result, in the present exemplary embodiment, the display light-emitting mesa 122a in the functional light-emitting diode chip LED and the redundant light-emitting mesa 122g in the dysfunctional light-emitting diode chip LED can accomplish similar display effects.

In the present exemplary embodiment, each of the light-emitting diode chips LED is a square light-emitting diode chip, for instance, and the side length of the square light-emitting diode chip is shorter than or equal to 100 micrometers, for instance. Specifically, the side length of each of the light-emitting diode chips LED is 100 micrometers, 63 micrometers, or the like. However, the light-emitting diode chips LED may not be the square light-emitting diode chips, and it is also likely to employ rectangular light-emitting diode chips as the sub-pixels SP in the display pixel 120. An operating current intensity of each of the light-emitting diode chips LED (including the display light-emitting mesa 122a or the redundant light-emitting mesa 122b) is less than 40 A/cm$^2$ according to the present exemplary embodiment, for instance.

With reference to FIG. 2A to FIG. 2E, a detailed description of the method of manufacturing the light-emitting diode chip LED is provided hereinafter.

FIG. 2A to FIG. 2E are schematic flowcharts of manufacturing the light-emitting diode chip according to the first exemplary embodiment of the disclosure. The upper portions of FIG. 2A to FIG. 2E are top views of the light-emitting diode chip, and the lower portions of FIG. 2A to FIG. 2E are cross-sectional views of the light-emitting diode chip taken along sections A-A' and B-B'.

With reference to FIG. 2A, a substrate SUB is provided, and the substrate SUB is made of sapphire, silicon, silicon carbide, and so on, for instance. A semiconductor device layer 122 having a plurality of display light-emitting mesas 122a and a plurality of redundant light-emitting mesas 122b is formed on the substrate SUB. In the present embodiment, the semiconductor device layer 122 includes a first-type doped semiconductor layer 122-1 (e.g., an n-type doped semiconductor layer), a first light-emitting layer 122-2 and a second light-emitting layer 122-3 (e.g., single- or multi-quantum well layers) separated from each others, and a second-type doped semiconductor layer (e.g., a p-type doped semiconductor layer). The first light-emitting layer 122-2 and the second light-emitting layer 122-3 are arranged on a portion of the first-type doped semiconductor layer 122-1, and the second-type doped semiconductor layer includes a first semiconductor pattern 122-4 and a second semiconductor pattern 122-5 separated from each other. The first semiconductor pattern 122-4 is located on the first light-emitting layer 122-2, and the second semiconductor pattern 122-5 is located on the second light-emitting layer 122-3. The first-type doped semiconductor layer 122-1, the first light-emitting layer 122-2, and the first semiconductor pattern 122-4 constitute the display light-emitting mesa 122a, and the first-type doped semiconductor layer 122-1, the second light-emitting layer 122-3, and the second semiconductor pattern 122-5 constitute the redundant light-emitting mesa 122b.

As shown in FIG. 2A, in addition to the display light-emitting mesas 122a and the redundant light-emitting mesas 122b, the semiconductor device layer 122 provided in the present exemplary embodiment may further include a plurality of dummy mesas 122c that cannot emit light. Each of the dummy mesas 122c has an opening H, so as to expose a portion of the first-type doped semiconductor layer 122-1. Note that the display light-emitting mesas 122a, the redundant light-emitting mesas 122b, and the dummy mesas 122c are formed by performing one patterning process (e.g., one photolithography and etching process); hence, the display light-emitting mesas 122a, the redundant light-emitting mesas 122b, and the dummy mesas 122c have the same film-stacking structure and the same height.

Figure 2B:
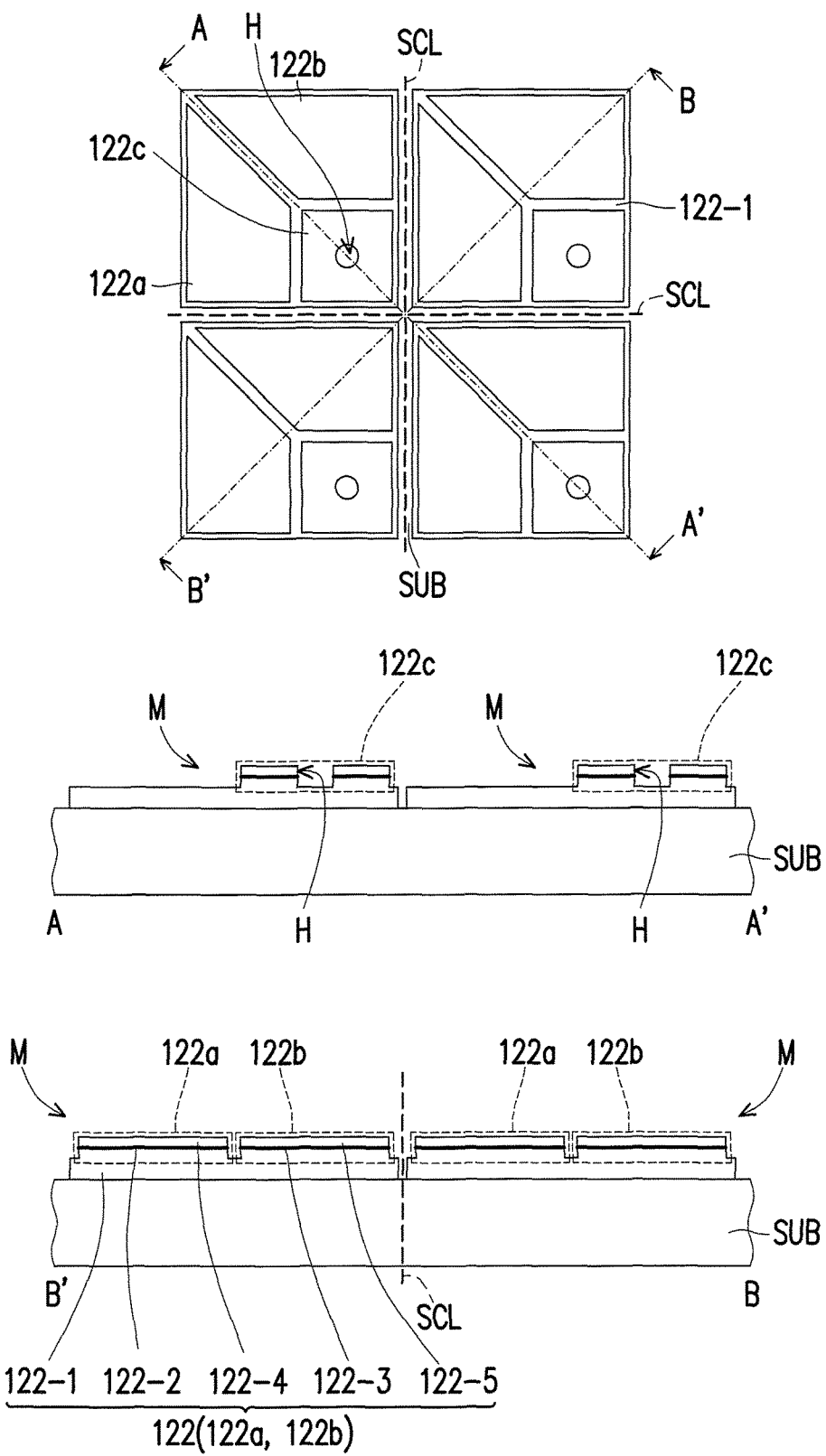

With reference to FIG. 2B, the first-type doped semiconductor layer 122-1 is patterned to form a plurality of mesa structures M separated from each other and arranged in an array on the substrate SUB, and each of the mesa structures M includes one display light-emitting mesa 122a, at least one redundant light-emitting mesa 122b, and one dummy mesa 122c. Note that the number of the at least one redundant light-emitting mesa 122b may be plural, and the mesa structures M have the square profiles, for instance. Certainly, the mesa structures M have the rectangular profiles based on actual design requirements, which should not be construed as a limitation in the disclosure. In the present exemplary embodiment, the mesa structures M arranged in an array on the substrate SUM are formed by performing one patterning process (e.g., one photolithography and etching process), for instance.

Figure 2C:
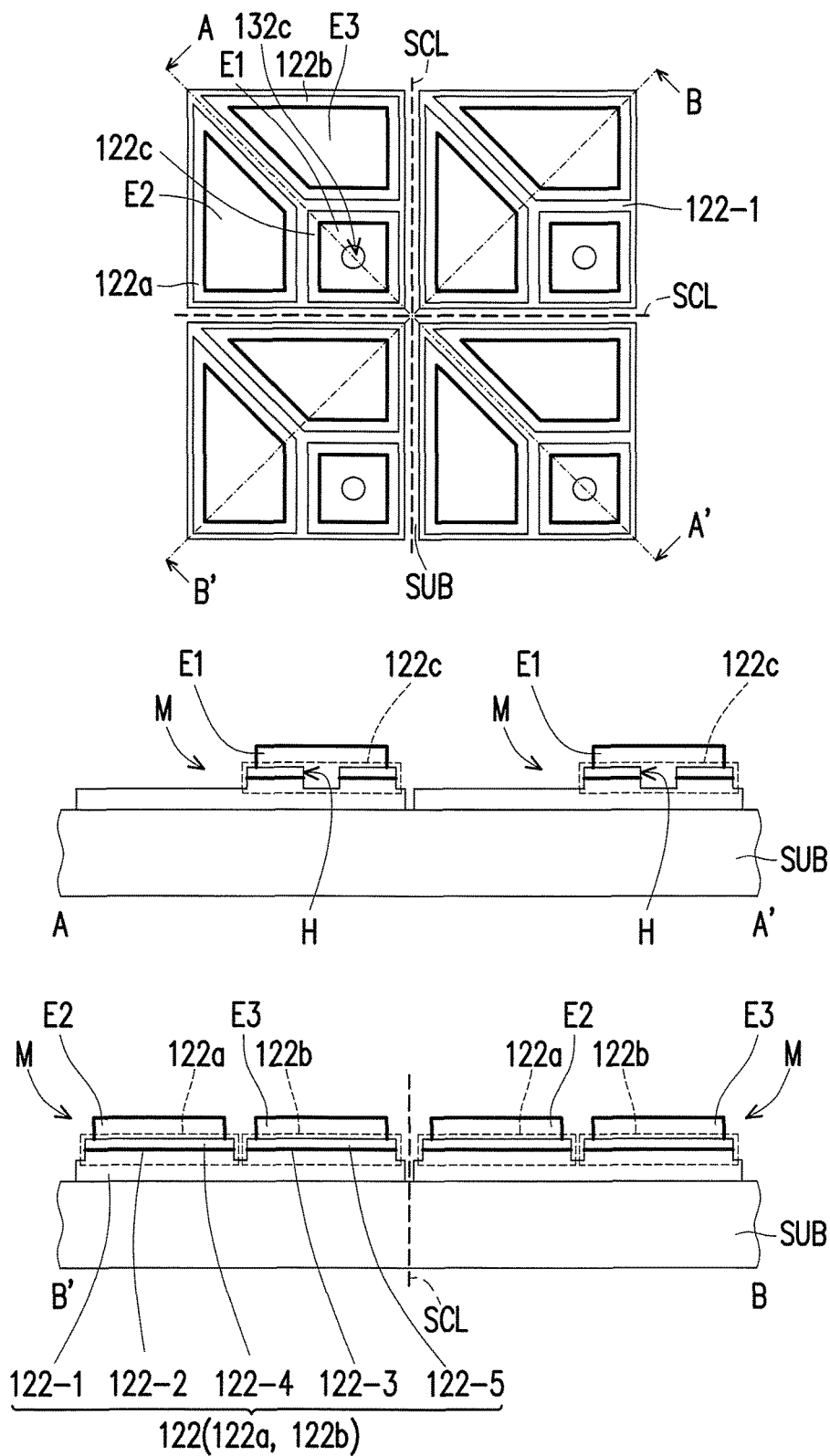

With reference to FIG. 2C, after the mesa structures M are completely formed, a first electrode E1, a second electrode E2, and a third electrode E3 are formed on each of the mesa structures M. The first electrode E1 is arranged on the dummy mesa 122c, and the opening H is electrically connected to the first-type doped semiconductor layer 122-1; the second electrode E2 is arranged on the display light-emitting mesa 122a and electrically connected to the first semiconductor pattern 122-4; the third electrode E3 is arranged on the at least one redundant light-emitting mesa 122b and electrically connected to the second semiconductor pattern 122-5.

Figure 2D:
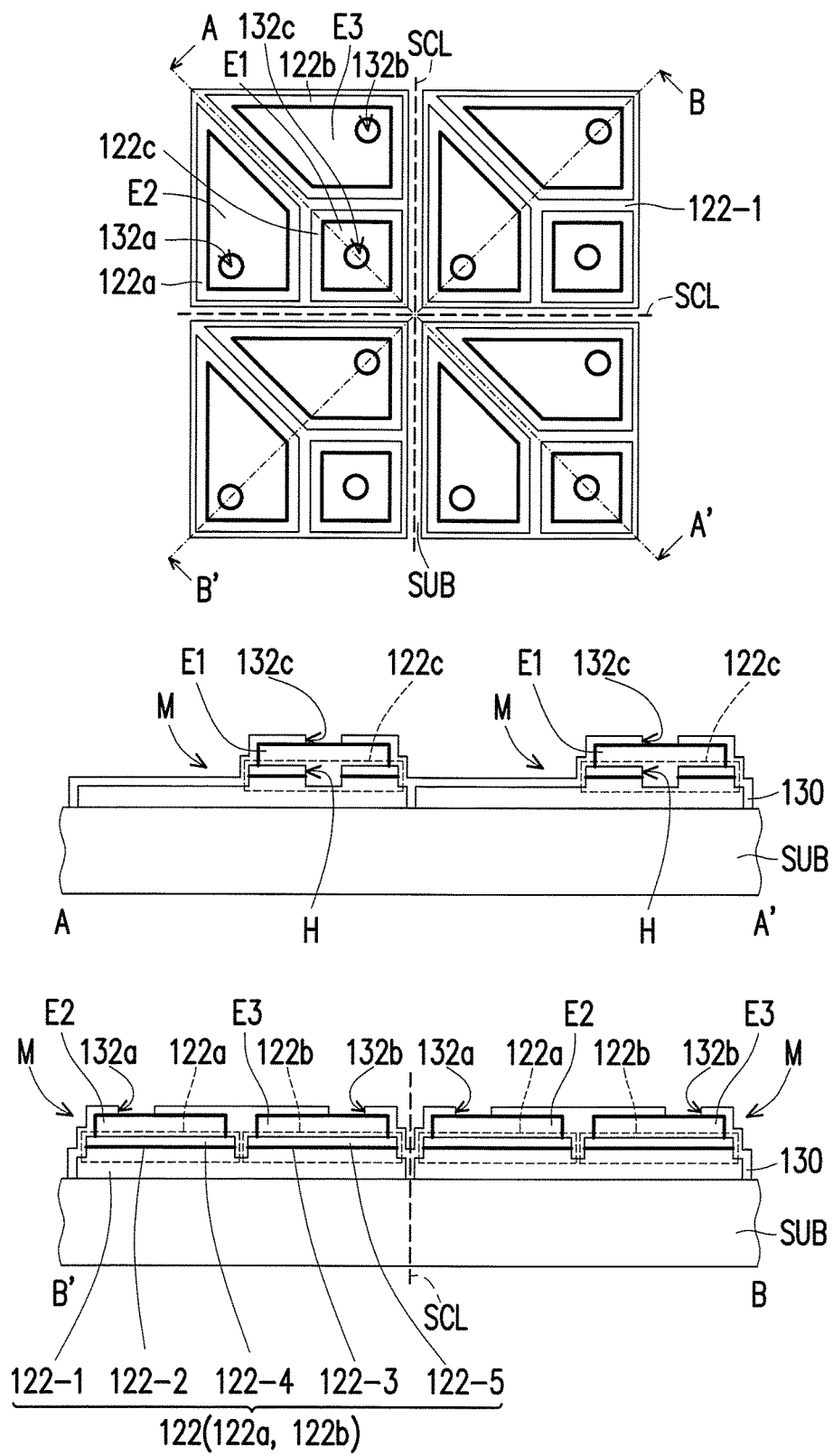

With reference to FIG. 2D, after the first electrode E1, the second electrode E2, and the third electrode E3 are formed, a passivation layer 130 is formed on each of the mesa structures M, so as to partially cover the first electrode E1, the second electrode E2, and the third electrode E3. In the present exemplary embodiment, the passivation layer 130 has a plurality of openings 132a, 132b, and 132c respectively exposing portions of the second electrode E2, the third electrode E3, and the first electrode E1.

Figure 2E:
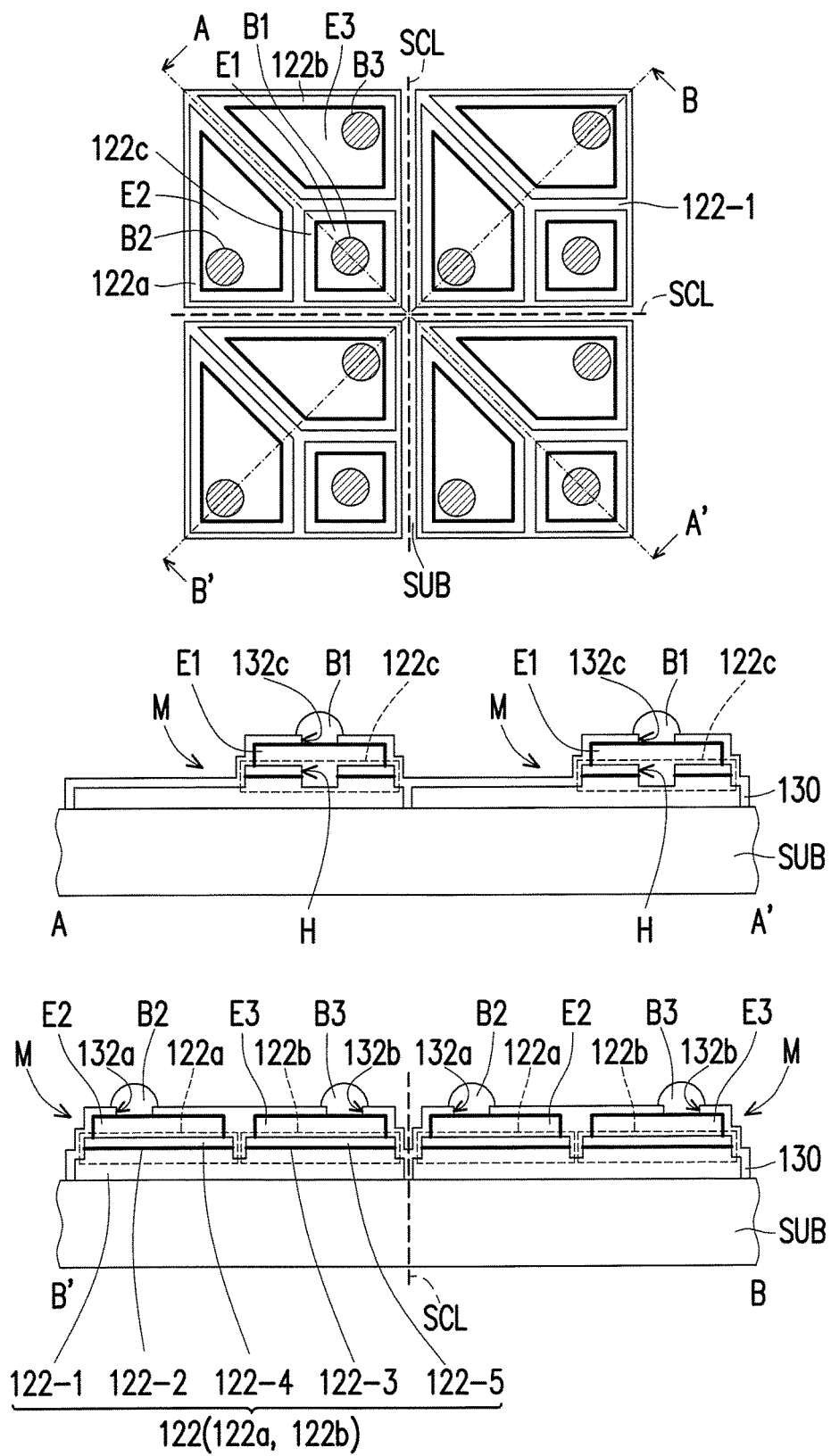

With reference to FIG. 2E, a first bump B1, a second bump B2, and a third bump B3 are respectively formed on the first electrode E1, the second electrode E2, and the third electrode E3. The first bump B1 is electrically connected to the first electrode E1 through the opening 132c, the second bump B2 is electrically connected to the second electrode E2 through the opening 132a, and the third bump B3 is electrically connected to the third electrode E3 through the opening 132b. After the first bump B1, the second bump B2, and the third bump B3 are completely formed, the passivation layer 130 and the substrate SUB are cut along a scribed line SCL, so as to finish the singulation step. Note that the singulation step may be omitted in the method of manufacturing the light-emitting diode chips according to the present exemplary embodiment. For instance, the light-emitting diode chip may be bonded to a temporary substrate, and the substrate SUB is removed, such that the light-emitting diode chip can be supported by the temporary substrate. The light-emitting diode chip located on the temporary substrate is then transfer-bonded to a permanent substrate. The way to bond the light-emitting diode chips to the permanent substrate is not limited in the present exemplary embodiment.

It can be learned from FIG. 2A to FIG. 2E that the process of manufacturing the light-emitting diode chips provided in the present exemplary embodiment is compatible to the existing manufacturing process; as long as the photomask design is modified, the mass production of the light-emitting diode chips through performing the process described herein is achievable without increasing significant costs.

It should be mentioned that the display light-emitting mesa 122a and the redundant light-emitting mesa 122b are grown on the same substrate SUB; that is, the display light-emitting mesa 122a and the redundant light-emitting mesa 122b are different components in one single light-emitting diode chip, and therefore the display pixel 12o having the display light-emitting mesa 122a and the redundant light-emitting mesa 122b may be considered as a chip scale package (CSP). Besides, the display pixel 120 can be completely packed at the wafer level; hence, the display pixel 120 can be considered as a wafer-level chip scale package (WL-CSP).

Second Exemplary Embodiment

Figure 3D:
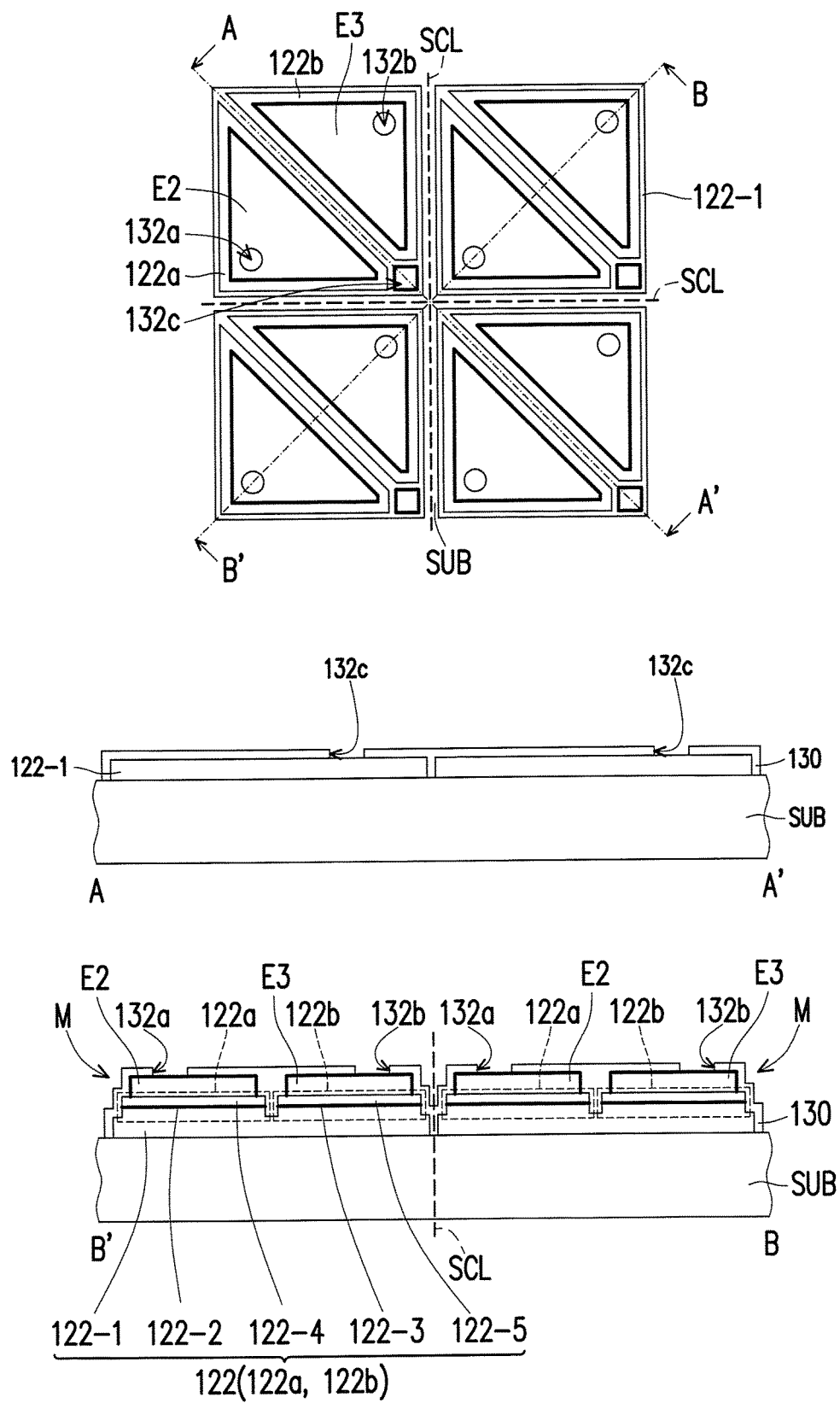

FIG. 3A to FIG. 3E are schematic flowcharts of manufacturing a light-emitting diode chip according to a second exemplary embodiment of the disclosure. With reference to FIG. 3A to FIG. 3E, the manufacturing process of the light-emitting diode chip provided in the present exemplary embodiment is similar to that provided in the first exemplary embodiment, while one of the differences therebetween lies in that the fabrication of the dummy mesa 122c is omitted in the manufacturing process of the light-emitting diode chip. Besides, compared to the display light-emitting mesa 122a and the redundant light-emitting mesa 122b provided in the first exemplary embodiment, the display light-emitting mesa 122a and the redundant light-emitting mesa 122b described in the present exemplary embodiment have the relatively large light-emitting area, as shown in FIG. 3A and FIG. 3B.

In addition to the above-mentioned differences, the second electrode E2 and the third electrode E3 provided herein are formed by performing one patterning process, and the first electrode E1 is formed by performing another patterning process. The passivation layer 130 is formed after the second electrode E2 and the third electrode E3 are completely formed, and the first electrode E1 is formed after the passivation layer 130 is completely formed, as shown in FIG. 3C and FIG. 3E. The first bump B1 is directly formed on and electrically connected to the first electrode E1, the second bump B2 is electrically connected to the second electrode E2 through the opening 132a, and the third bump B3 is electrically connected to the third electrode E3 through the opening 132b. The first electrode E1 is electrically connected to the first-type doped semiconductor layer 122-1 through the opening 132c (as shown in FIG. 3E).

Third Exemplary Embodiment

Figure 4A:
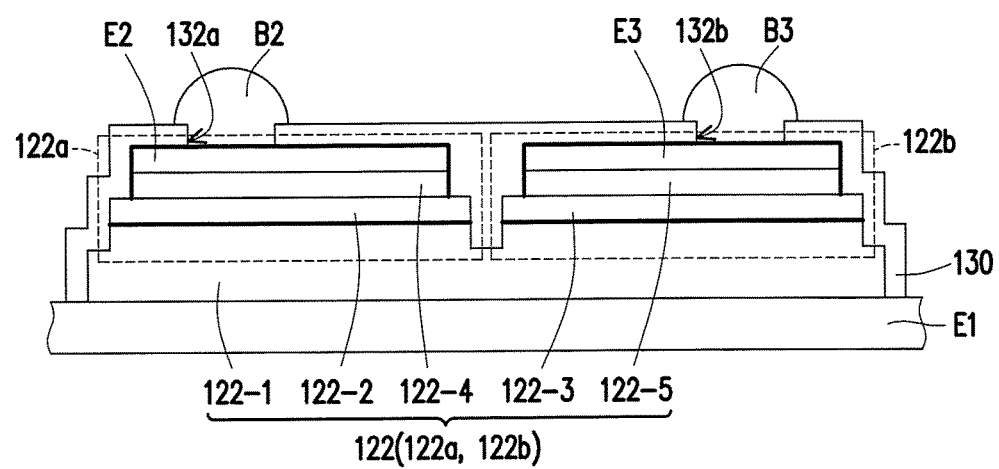
FIG. 4A is a schematic cross-sectional diagram illustrating a light-emitting diode chip according to a third exemplary embodiment of the disclosure.
Figure 4B:
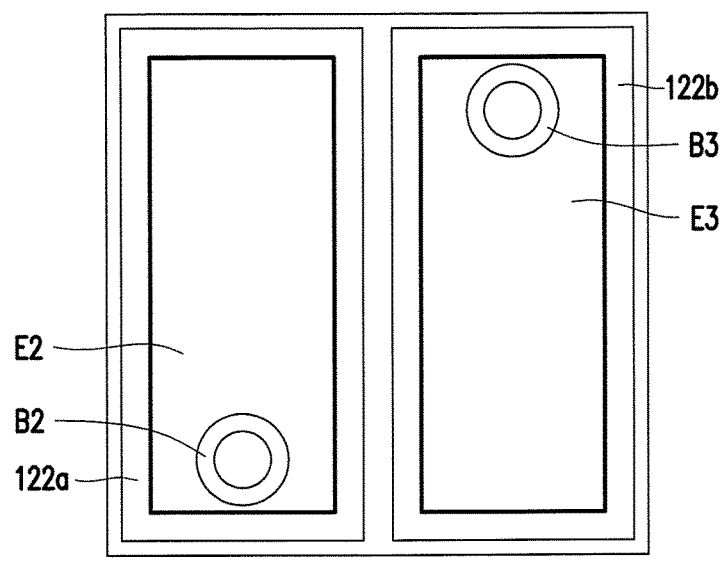
FIG. 4B and FIG. 4C are top views of the light-emitting diode chip according to the third exemplary embodiment of the disclosure.
Figure 4C:
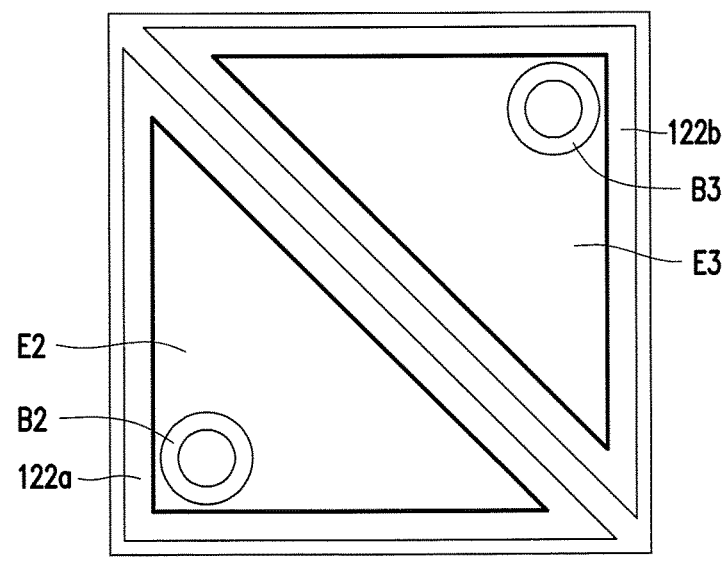

FIG. 4A is a schematic cross-sectional diagram illustrating a light-emitting diode chip according to a third embodiment of the disclosure. FIG. 4B and FIG. 4C are top views of the light-emitting diode chip according to the third embodiment of the disclosure. With reference to FIG. 4A to FIG. 4E, the light-emitting diode chip provided in the present exemplary embodiment is similar to that provided in the first exemplary embodiment, while the main difference therebetween lies in that the light-emitting diode chip provided herein is a vertical-type light-emitting diode chip. It can be learned from FIG. 4A that the first electrode E1 in the light-emitting diode chip provided herein is located on one side of the semiconductor device layer 122 and electrically connected to the first-type doped semiconductor layer 122-a, and the second electrode E2 and the third electrode E3 are located on the other side of the semiconductor device layer 122 and electrically connected to the first semiconductor pattern 122-4 and the second semiconductor pattern 122-5. In the present exemplary embodiment, the semiconductor device layer 122 also includes the display light-emitting mesa 122a and at least one redundant light-emitting mesa 122b.

The first, second, and third electrodes E1, E2, and E3 are located on two sides of the semiconductor device layer 122; hence, the area occupied by the display light-emitting mesa 122a and the area occupied by the redundant light-emitting mesa 122b can be maximized without being affected by the first electrode E1.

To sum up, in the display pixel and the display panel provided in the disclosure, the light-emitting diode chips acting as the sub-pixels not only have the display light-emitting mesas but also have the redundant light-emitting mesas that can replace the display light-emitting mesas. If the display light-emitting mesas cannot perform the normal display function, the redundant light-emitting mesas can be driven by appropriate circuit to emit light; thereby replacing the display light-emitting mesas to perform the display function. As such, the defective dots cannot be easily formed in the display pixel and the display panel provided herein, and thus the manufacturing yield can be significantly improved. Moreover, the manufacturing yield of the display pixel and the display panel can be significantly improved without increasing the dimension of the display pixel or increasing the distance between the display pixels in the pixel array.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A display pixel adapted to be arranged on a carrier, the display pixel comprising:
   a plurality of light-emitting diode chips arranged on and electrically connected to the carrier, each of the light-emitting diode chips respectively acting as a sub-pixel and comprising a semiconductor device layer in a single light-emitting diode chip among the light-emitting diode chips, the semiconductor device layer comprising a display light-emitting mesa and at least one redundant light-emitting mesa, wherein during a period of driving each of the light-emitting diode chips, one of the display light-emitting mesa and the at least one redundant light-emitting mesa in each of the light-emitting diode chips is capable of emitting light; the redundant light-emitting mesa configured to emit light in place of the display light-emitting mesa when the display light-emitting mesa is disabled.

2. The display pixel as recited in claim 1, wherein a side length of each of the light-emitting diode chips is shorter than or equal to 100 micrometers.

3. The display pixel as recited in claim 1, wherein the semiconductor device layer in each of the light-emitting diode chips comprises:
   a first-type doped semiconductor layer;
   a first light-emitting layer and a second light-emitting layer separated from each other and arranged on a portion of the first-type doped semiconductor layer; and
   a second-type doped semiconductor layer comprising a first semiconductor pattern and a second semiconductor pattern separated from each other, wherein the first semiconductor pattern is located on the first light-emitting layer, the second semiconductor pattern is located on the second light-emitting layer, the first semiconductor pattern and the first light-emitting layer constitute at least one portion of the display light-emitting mesa, and the second semiconductor pattern and the second light-emitting layer constitute at least one portion of the at least one redundant light-emitting mesa.

4. The display pixel as recited in claim 1, wherein the light-emitting diode chips emit a plurality of color beams.

5. A display panel comprising:
   a carrier;
   a plurality of display pixels adapted to be arranged on the carrier, each display pixel comprising:
   a plurality of light-emitting diode chips arranged on and electrically connected to the carrier, each of the light-emitting diode chips respectively acting as a sub-pixel and comprising a semiconductor device layer in a single light-emitting diode chip among the light-emitting diode chips, the semiconductor device layer comprising a display light-emitting mesa and at least one redundant light-emitting mesa, wherein during a period of driving each of the light-emitting diode chips, one of the display light-emitting mesa and the at least one redundant light-emitting mesa in each of the light-emitting diode chips is capable of emitting light; the redundant light-emitting mesa configured to emit light in place of the display light-emitting mesa when the display light-emitting mesa is disabled;
   wherein the plurality of display pixels are arranged in an array on the carrier.

6. The display panel as recited in claim 5, wherein the carrier comprises a circuit board or a complementary metal oxide semiconductor integrated circuit.

7. The display panel as recited in claim 5, wherein a side length of each of the light-emitting diode chips is shorter than or equal to 100 micrometers.

8. The display panel as recited in claim 7, wherein the carrier comprises a circuit board or a complementary metal oxide semiconductor integrated circuit.

9. The display panel as recited in claim 5, wherein the semiconductor device layer in each of the light-emitting diode chips comprises:
   a first-type doped semiconductor layer;
   a first light-emitting layer and a second light-emitting layer separated from each other and arranged on a portion of the first-type doped semiconductor layer; and
   a second-type doped semiconductor layer comprising a first semiconductor pattern and a second semiconductor pattern separated from each other, wherein the first semiconductor pattern is located on the first light-emitting layer, the second semiconductor pattern is located on the second light-emitting layer, the first semiconductor pattern and the first light-emitting layer constitute at least one portion of the display light-emitting mesa, and the second semiconductor pattern and the second light-emitting layer constitute at least one portion of the at least one redundant light-emitting mesa.

10. The display panel as recited in claim 9, wherein the carrier comprises a circuit board or a complementary metal oxide semiconductor integrated circuit.

11. The display panel as recited in claim 5, wherein the light-emitting diode chips emit a plurality of color beams.

12. The display panel as recited in claim 11, wherein the carrier comprises a circuit board or a complementary metal oxide semiconductor integrated circuit.

13. A method of driving a display panel, comprising:
providing a display panel, the display panel comprising a carrier and a plurality of display pixels arranged in an array on the carrier, each display pixel comprising:
a plurality of light-emitting diode chips arranged on and electrically connected to the carrier, each of the light-emitting diode chips respectively acting as a sub-pixel and comprising a semiconductor device layer in a single light-emitting diode chip among the light-emitting diode chips, the semiconductor device layer comprising a display light-emitting mesa and at least one redundant light-emitting mesa, wherein during a period of driving each of the light-emitting diode chips, one of the display light-emitting mesa and the at least one redundant light-emitting mesa in each of the light-emitting diode chips is capable of emitting light; the redundant light-emitting mesa configured to emit light in place of the display light-emitting mesa when the display light-emitting mesa is disabled;
driving the display pixels by the carrier and detecting whether the display light-emitting mesas in the display pixels perform a display function normally; and
if at least one of the display pixels is deemed as an abnormal display pixel, disabling the display light-emitting mesa in the abnormal display pixel and enabling the at least one redundant light-emitting mesa in the abnormal display pixel.

14. The method as recited in claim 13, wherein each of the display pixels comprises a wafer-level chip scale package.

15. The method as recited in claim 13, wherein a method of detecting whether the display light-emitting mesas in the display pixels perform the display function normally comprises: measuring a current-voltage correlation of the display light-emitting mesas to determine whether abnormal open circuit or short circuit occurs in each of the display light-emitting mesas.

16. The method as recited in claim 13, wherein a control circuit of the carrier detects whether the display light-emitting mesas in the display pixels perform the display function normally.

17. The method as recited in claim 13, wherein a side length of each of the light-emitting diode chips is shorter than or equal to 100 micrometers.

18. The method as recited in claim 13, wherein the semiconductor device layer in each of the light-emitting diode chips comprises:
a first-type doped semiconductor layer;
a first light-emitting layer and a second light-emitting layer separated from each other and arranged on a portion of the first-type doped semiconductor layer; and
a second-type doped semiconductor layer comprising a first semiconductor pattern and a second semiconductor pattern separated from each other, wherein the first semiconductor pattern is located on the first light-emitting layer, the second semiconductor pattern is located on the second light-emitting layer, the first semiconductor pattern and the first light-emitting layer constitute at least one portion of the display light-emitting mesa, and the second semiconductor pattern and the second light-emitting layer constitute at least one portion of the at least one redundant light-emitting mesa.

19. The method as recited in claim 13, wherein the light-emitting diode chips emit a plurality of color beams.

* * * * *